United States Patent
Saito (10) Patent No.: US 10,056,344 B2
(45) Date of Patent: Aug. 21, 2018

(54) SEMICONDUCTOR DEVICE (71) Applicant: OLYMPUS CORPORATION, Hachioji-shi, Tokyo (JP)

(72) Inventor: Haruhisa Saito, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/793,173

(22) Filed: Oct. 25, 2017

(65) Prior Publication Data

US 2018/0047694 A1 Feb. 15, 2018

Related U.S. Application Data

(63) Continuation of application No. PCT/JP2015/062805, filed on Apr. 28, 2015.

(51) Int. Cl.
  *H01L 23/48* (2006.01)
  *H01L 23/00* (2006.01)
(52) U.S. Cl.
  CPC .............. *H01L 24/11* (2013.01); *H01L 24/13* (2013.01); *H01L 2224/11* (2013.01); *H01L 2224/13* (2013.01)
(58) Field of Classification Search
  CPC ......... H01L 24/11; H01L 24/13; H01L 24/16; H01L 24/27; H01L 24/83; H01L 24/92; H01L 24/94; H01L 25/0657; H01L 25/50; H01L 27/14634; H01L 27/14636
  USPC ....................................... 257/737
  See application file for complete search history.

(56) References Cited

U.S. PATENT DOCUMENTS

| 2013/0181316 A1* | 7/2013 | Tsukimura ........ H01L 31/02016 257/443 |
| 2014/0291486 A1 | 10/2014 | Nagano et al. |
| 2015/0357300 A1* | 12/2015 | Saito ....................... H01L 24/13 257/737 |

FOREIGN PATENT DOCUMENTS

| JP | 2005-109000 A | 4/2005 |
| JP | 2006-41011 | 2/2006 |
| JP | 2007-194274 | 8/2007 |
| JP | 2009-94545 A | 4/2009 |
| JP | 2011-3586 | 1/2011 |
| JP | 2013-89919 A | 5/2013 |

OTHER PUBLICATIONS

International Search Report dated Jul. 28, 2015, issued in counterpart of International Application No. PCT/JP2015/062805 (4 pages) w/English Translation.

* cited by examiner

*Primary Examiner* — Brook Kebede
(74) *Attorney, Agent, or Firm* — Westerman, Hattori, Daniels & Adrian, LLP (57) ABSTRACT

A first surface of a first substrate included in a semiconductor device includes a first area in which a plurality of first connecting portions are disposed and a second area in which a plurality of second connecting portions are disposed. A second surface of a second substrate included in the semiconductor device includes a third area in which the plurality of first connecting portions are disposed and a fourth area in which the plurality of second connecting portions are disposed. The second area surrounds the first area on the first surface. The fourth area surrounds the third area on the second surface. A height of the second base electrode in a thickness direction of the first substrate is greater than a height of the first base electrode in the thickness direction.

4 Claims, 9 Drawing Sheets

SEMICONDUCTOR DEVICE

The present application is a continuation application based on International Patent Application No. PCT/JP2015/062805, filed Apr. 28, 2015, the content of which is incorporated herein by reference.

BACKGROUND OF THE INVENTION

Field of the Invention

The present invention relates to a semiconductor device.

Description of Related Art

A laminated solid-state imaging device includes two substrates (a pixel wafer and a read wafer). The pixel wafer includes a plurality of pixels. The read wafer includes a circuit configured to read signals from a plurality of pixels. A method of connecting these two wafers has been studied. For example, a first method of connecting these two wafers at each pixel by a fine bump electrode has been provided. Alternatively, a second method of connecting these two wafers around pixels at each line has been provided. In the first method, a finer bump electrode is necessary. As the bump electrode, a solder bump electrode, a copper (Cu) bump electrode, and a gold (Au) bump electrode have been studied. In particular, as an electrode of a laminated solid-state imaging device, an electrode structure using a microparticle gold (Au) bump electrode has been studied.

A method of forming a gold (Au) bump electrode includes electroplating and electroless plating. In the electroplating, an electric field is generated when a current flows in a seed layer, and a metal structure is formed only on a surface of the seed layer that is exposed to a plating bath. In the electroless plating, a metal structure is formed only on a metal surface that is exposed to a plating bath. Variation in height, within a wafer surface, of a bump electrode formed by electroless plating through which a seed layer can be patterned before plating is performed is smaller than in electroplating.

Although a speed of electroplating is high, a speed within a wafer surface depends on an electric field distribution. Electroplating is not suitable for forming a microstructure because there is a process of removing a seed layer after electroplating. On the other hand, although a speed of electroless plating is low, variation in height of a bump electrode within a wafer surface is small. In addition, electroless plating is suitable for forming a microstructure because a seed layer can be patterned before plating.

However, in a solid-state imaging device in which two substrates are laminated through a bump electrode formed by electroless plating, connection defects of the bump electrode may occur. A connection defect of a bump electrode will be described below.

Figure 9:
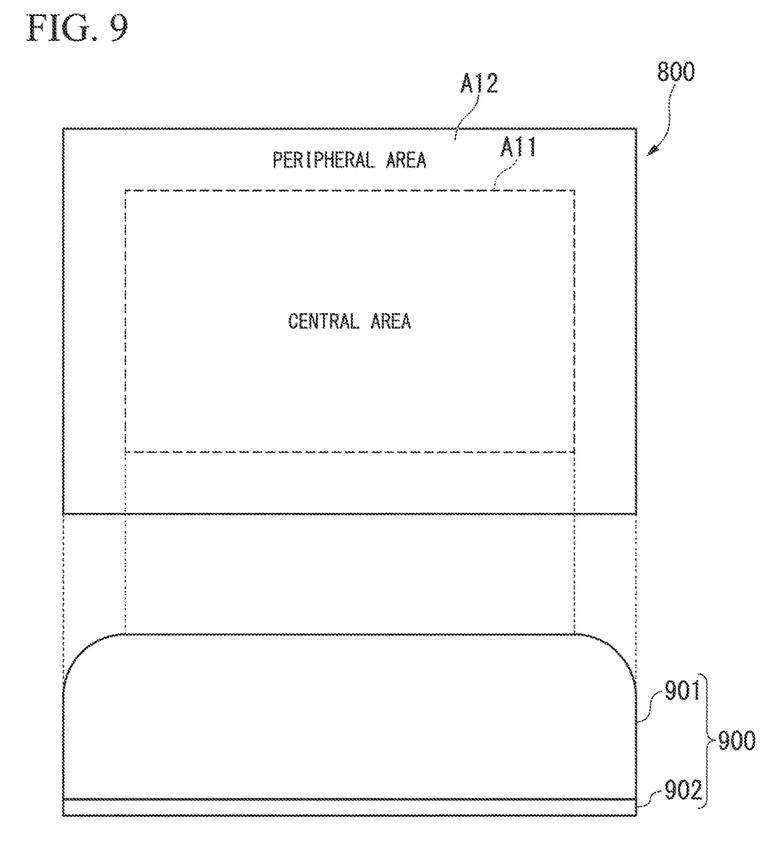
FIG. 9 is a plan view of a substrate and a cross-sectional view of a connecting portion in the related art.

FIG. 9 is a plan view of a substrate 800 and a cross-sectional view of a connecting portion 900. The substrate 800 is one of two substrates constituting a solid-state imaging device. The connecting portion 900 electrically connects the substrate 800 and another substrate. The connecting portion 900 includes a bump 901 and a base electrode 902. The bump 901 is disposed on a surface of the base electrode 902. The base electrode 902 is disposed on a surface of the substrate 800.

In FIG. 9, the substrate 800 and the connecting portion 900 are schematically shown. For example, a ratio between a width of the substrate 800 and a height of the connecting portion 900 is different from this ratio in an actual solid-state imaging device. A plurality of connecting portions 900 are disposed on a surface of the substrate 800 at high density. In FIG. 9, the connecting portion 900 is drawn as an aggregate of a plurality of connecting portions.

The bump 901 after electroless plating has variation in height. The variation in height of the bump 901 in a central area A1 of the substrate 800 is small. However, the variation in height of the bump 901 in a peripheral area A12 surrounding the central area A11 is large. The height of the bump 901 in the peripheral area A12 is smaller than the height of the bump 901 in the central area A11 on average. The height of the bump 901 in the peripheral area A12 tends to become smaller from the center of the substrate 800 toward the outside. A difference between the height of the bump 901 in the central area A11 and the height of the bump 901 in the outermost portion of the peripheral area A12 is about several hundred nanometers (nm). This difference is about 5% of the height of the bump 901 in the central area A11.

The substrate 800 and the other substrate are connected through the connecting portion 900. Due to the variation in height of the bump 901 in the peripheral area A12, the bump 901 disposed in the peripheral area A12 may not be connected to the other substrate. That is, a connection defect of the bump 901 in the peripheral area A12 occurs. In the solid-state imaging device, the central area A11 and the peripheral area A12 are pixel areas in which pixels are disposed. Therefore, defective pixels due to this connection defect in the peripheral area A12 may occur.

Several methods of reducing variation in height of the bump electrodes in the pixel area after electroless plating have been studied. One method is a chemical mechanical polishing (CMP) method. In this method, mechanical polishing is performed by a polishing pad and simultaneously a bump electrode is etched by a chemical agent called slurry. Accordingly, the surface of the upper part of the bump electrode is flattened. Another method is a method using a cutting tool disclosed in Japanese Unexamined Patent Application, First Publication No. 2009-094545. In this method, the upper part of the bump electrode is cut by a cutting tool and thus the surface of the upper part of the bump electrode is flattened.

SUMMARY OF THE INVENTION

According to a first aspect of the present invention, a semiconductor device includes a plurality of first connecting portions, a plurality of second connecting portions, a first substrate, and a second substrate. The plurality of first connecting portions electrically connect a first wiring and a second wiring. The plurality of second connecting portions electrically connect the first wiring and the second wiring. The first substrate includes a first surface and the first wiring and contains a first semiconductor material. The first surface includes a first area in which the plurality of first connecting portions are disposed and a second area in which the plurality of second connecting portions are disposed. The second substrate includes a second surface and the second wiring, and contains a second semiconductor material. The second surface faces the first surface. The second surface includes a third area in which the plurality of first connecting portions are disposed and a fourth area in which the plurality of second connecting portions are disposed. Each of the plurality of first connecting portions includes a first bump and a first base electrode. The first base electrode is disposed between any one of the first area and the third area, and the first bump. Each of the plurality of second connecting portions includes a second bump and a second base electrode. The second base electrode is disposed between any one of the second area and the fourth area, and the second bump. The second area surrounds the first area on the first surface. The fourth area surrounds the third area on the second surface. A height of the second base electrode in a thickness direction of the first substrate is greater than a height of the first base electrode in the thickness direction.

According to a second aspect of the present invention, in the first aspect, a diameter of the second bump may be smaller than a diameter of the first bump.

According to a third aspect of the present invention, in the first aspect, the semiconductor device may further include a plurality of third connecting portions that electrically connect the first wiring and the second wiring. The first surface may further include a fifth area in which the plurality of third connecting portions are disposed. The second surface may further include a sixth area in which the plurality of third connecting portions are disposed. Each of the plurality of third connecting portions includes a third bump and a third base electrode. The third base electrode is disposed between any one of the fifth area and the sixth area, and the third bump. The fifth area surrounds the first area and the second area on the first surface. The sixth area surrounds the third area and the fourth area on the second surface. A height of the third base electrode in the thickness direction may be greater than the height of the second base electrode in the thickness direction.

According to a fourth aspect of the present invention, in the first aspect, a height of the second connecting portion in the thickness direction may be greater than a height of the first connecting portion in the thickness direction.

DETAILED DESCRIPTION OF THE INVENTION

Embodiments of the present invention will be described with reference to the drawings.

First Embodiment

Figure 1:
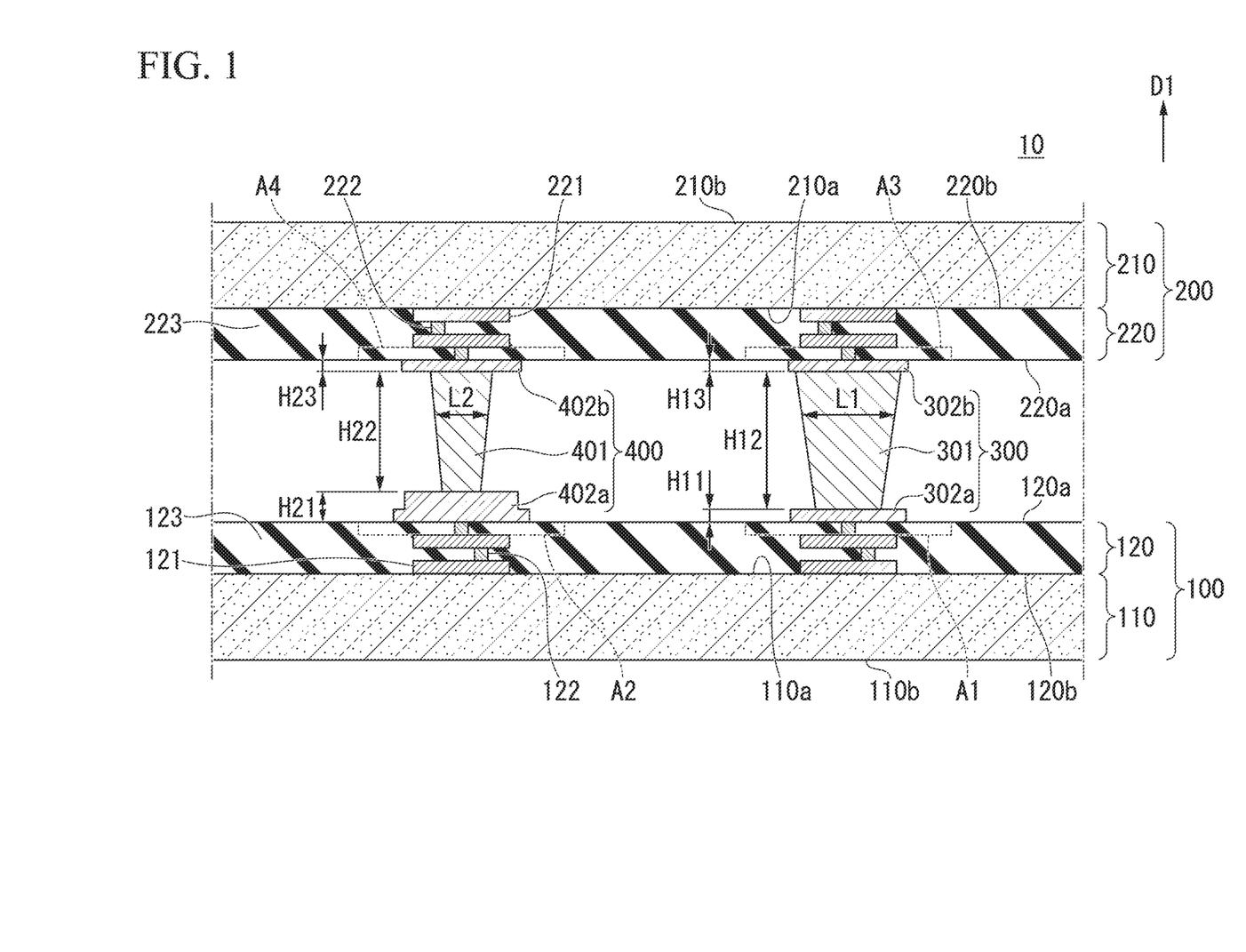
FIG. 1 is a cross-sectional view of a semiconductor device according to a first embodiment of the present invention.

FIG. 1 shows a configuration of a semiconductor device 10 according to a first embodiment of the present invention.

In FIG. 1, a cross section of the semiconductor device 10 is shown. As shown in FIG. 1, the semiconductor device 10 includes a first substrate 100, a second substrate 200, a first connecting portion 300, and a second connecting portion 400. The first substrate 100 and the second substrate 200 are connected through the first connecting portion 300 and the second connecting portion 400. The first substrate 100 and the second substrate 200 are laminated in a thickness direction D1 of the first substrate 100.

The semiconductor device 10 includes a plurality of first connecting portions 300. In FIG. 1, one first connecting portion 300 is shown as a representative. The semiconductor device 10 includes a plurality of second connecting portions 400. In FIG. 1, one second connecting portion 400 is shown as a representative.

The sizes of portions constituting the semiconductor device 10 may not comply with the sizes shown in FIG. 1. The sizes of portions constituting the semiconductor device 10 are arbitrary. In FIG. 1, the height of portions constituting the semiconductor device 10 is indicated as the length in the thickness direction D1 of the first substrate 100.

The first substrate 100 includes a first semiconductor layer 110 and a first wiring layer 120. The first semiconductor layer 110 and the first wiring layer 120 overlap in the thickness direction D1 of the first substrate 100. In addition, the first semiconductor layer 110 and the first wiring layer 120 are in contact with each other.

The first semiconductor layer 110 is made of a first semiconductor material. That is, the first substrate 100 contains the first semiconductor material. For example, the first semiconductor material is silicon (Si). The first semiconductor layer 110 includes a surface 110a and a surface 110b. The surface 110a and the surface 110b face in opposite directions. The surface 110a is in contact with the first wiring layer 120. The surface 110b constitutes one main surface of the first substrate 100. The main surface is the widest surface among a plurality of surfaces constituting the surface of the substrate.

The first wiring layer 120 includes a first wiring 121, a first via 122, and a first interlayer insulating film 123. While there are a plurality of first wirings 121 in FIG. 1, the reference sign of one first wiring 121 is shown as a representative. While there are a plurality of first vias 122 in FIG. 1, the reference sign of one first via 122 is shown as a representative.

The first wiring layer 120 includes a surface 120a (a first surface) and a surface 120b. The surface 120a faces the second substrate 200. The surface 120a is in contact with the first connecting portion 300 and the second connecting portion 400. The surface 120b is in contact with the first semiconductor layer 110. The surface 120a constitutes one main surface of the first substrate 100.

The first wiring 121 and the first via 122 are made of a first conductive material. For example, the first conductive material is a metal such as aluminum (Al) and copper (Cu). The first wiring 121 is a thin film in which a wiring pattern is formed. The first wiring 121 transmits a signal. A first wiring 121 having only one layer may be formed, or first wirings 121 having a plurality of layers may be formed. In the example shown in FIG. 1, first wirings 121 having two layers are formed.

The first via 122 connects the first wirings 121 of different layers. In the first wiring layer 120, portions other than the first wiring 121 and the first via 122 are formed in the first interlayer insulating film 123. The first interlayer insulating film 123 is made of a first insulating material. For example, the first insulating material is silicon dioxide ($SiO_2$).

At least one of the first semiconductor layer 110 and the first wiring layer 120 may include a circuit element such as a transistor.

The first substrate 100 includes the surface 120a (a first surface) and the first wiring 121, and contains the first semiconductor material. The surface 120a includes a first area A1 in which a plurality of first connecting portions 300 are disposed and a second area A2 in which a plurality of second connecting portions 400 are disposed.

The second substrate 200 includes a second semiconductor layer 210 and a second wiring layer 220. The second semiconductor layer 210 and the second wiring layer 220 overlap in the thickness direction D1 of the first substrate 100. In addition, the second semiconductor layer 210 and the second wiring layer 220 are in contact with each other.

The second semiconductor layer 210 is made of a second semiconductor material. That is, the second substrate 200 contains the second semiconductor material. For example, the second semiconductor material is silicon (Si). The second semiconductor layer 210 includes a surface 210a and a surface 210b. The surface 210a and the surface 210b face in opposite directions. The surface 210a is in contact with the second wiring layer 220. The surface 210b constitutes one main surface of the second substrate 200.

The second wiring layer 220 includes a second wiring 221, a second via 222, and a second interlayer insulating film 223. While there are a plurality of second wirings 221 in FIG. 1, the reference sign of one second wiring 221 is shown as a representative. While there are a plurality of second vias 222 in FIG. 1, the reference sign of one second via 222 is shown as a representative.

The second wiring layer 220 includes a surface 220a (a second surface) and a surface 220b. The surface 220a faces the first substrate 100. The surface 220a is in contact with the first connecting portion 300 and the second connecting portion 400. The surface 220b is in contact with the second semiconductor layer 210. The surface 220a constitutes one main surface of the second substrate 200.

The second wiring 221 and the second via 222 are made of a second conductive material. For example, the second conductive material is a metal such as aluminum (Al) and copper (Cu). The second wiring 221 is a thin film in which a wiring pattern is formed. The second wiring 221 transmits a signal. A second wiring 221 having only one layer may be formed, and second wirings 221 having a plurality of layers may be formed. In the example shown in FIG. 1, second wirings 221 having two layers are formed.

The second via 222 connects the second wirings 221 of different layers. In the second wiring layer 220, portions other than the second wiring 221 and the second via 222 are formed in the second interlayer insulating film 223. The second interlayer insulating film 223 is made of a second insulating material. For example, the second insulating material is silicon dioxide (SiO$_2$).

At least one of the second semiconductor layer 210 and the second wiring layer 220 may include a circuit element such as a transistor.

The second substrate 200 includes the surface 220a (a second surface) and the second wiring 221, and contains the second semiconductor material. The surface 220a faces the surface 120a. The surface 220a includes a third area A3 in which a plurality of first connecting portions 300 are disposed and a fourth area A4 in which a plurality of second connecting portions 400 are disposed.

The first connecting portion 300 and the second connecting portion 400 are disposed between the first substrate 100 and the second substrate 200. The first connecting portion 300 is disposed in the first area A1 on the surface 120a and disposed in the third area A3 on the surface 220a. The second connecting portion 400 is disposed in the second area A2 on the surface 120a and is disposed in the fourth area A4 on the surface 220a. The first connecting portion 300 and the second connecting portion 400 electrically connect the first wiring 121 to the second wiring 221.

The first connecting portion 300 includes a first bump 301, a first base electrode 302a, and a first base electrode 302b. The first bump 301, the first base electrode 302a, and the first base electrode 302b are made of a third conductive material. For example, the third conductive material is a metal such as gold (Au), aluminum (Al), and copper (Cu).

The first bump 301 is disposed between the first base electrode 302a and the first base electrode 302b. The first bump 301 is in contact with the first base electrode 302a and the first base electrode 302b. The first base electrode 302a and the first base electrode 302b are disposed between any one of the first area A1 and the third area A3, and the first bump 301. In FIG. 1, the first base electrode 302a is disposed between the first area A1 and the first bump 301. The first base electrode 302a is in contact with the first area A1. The first base electrode 302a is in contact with the first via 122 in the first area A1. In FIG. 1, the first base electrode 302b is disposed between the third area A3 and the first bump 301. The first base electrode 302b is in contact with the third area A3. The first base electrode 302b is in contact with the second via 222 in the third area A3.

The second connecting portion 400 includes a second bump 401, a second base electrode 402a, and a second base electrode 402b. The second bump 401, the second base electrode 402a, and the second base electrode 402b are made of a fourth conductive material. For example, the fourth conductive material is a metal such as gold (Au), aluminum (Al), and copper (Cu).

The second bump 401 is disposed between the second base electrode 402a and the second base electrode 402b. The second bump 401 is in contact with the second base electrode 402a and the second base electrode 402b. The second base electrode 402a and the second base electrode 402b are disposed between any one of the second area A2 and the fourth area A4, and the second bump 401. In FIG. 1, the second base electrode 402a is disposed between the second area A2 and the second bump 401. The second base electrode 402a is in contact with the second area A2. The second base electrode 402a is in contact with the first via 122 in the second area A2. In FIG. 1, the second base electrode 402b is disposed between the fourth area A4 and the second bump 401. The second base electrode 402b is in contact with the fourth area A4. The second base electrode 402b is in contact with the second via 222 in the fourth area A4.

A height H21 of the second base electrode 402a in the thickness D1 direction of the first substrate 100 is greater than a height H11 of the first base electrode 302a in the thickness direction D1. For example, the first base electrode 302a and the second base electrode 402a include first layers formed at the same time. The second base electrode 402a further includes a second layer formed on the first layer.

A height H22 of the second bump 401 in the thickness D1 direction of the first substrate 100 is smaller than a height H12 of the first bump 301 in the thickness direction D1. A total of the height H11 of the first base electrode 302a and the height H12 of the first bump 301 and a total of the height H21 of the second base electrode 402a and the height H22 of the second bump 401 are almost the same.

A height H13 of the first base electrode 302b in the thickness D1 direction of the first substrate 100 and a height H23 of the second base electrode 402b in the thickness direction D1 are almost the same. Therefore, a height of the first connecting portion 300 in the thickness D1 direction of the first substrate 100 and a height of the second connecting portion 400 in the thickness direction D1 are almost the same. The height of the first connecting portion 300 is a total of the height H11 of the first base electrode 302a, the height H12 of the first bump 301, and the height H13 of the first base electrode 302b. The height of the second connecting portion 400 is a total of the height H21 of the second base electrode 402a, the height H22 of the second bump 401, and the height H23 of the second base electrode 402b.

A diameter L2 of the second bump 401 is smaller than a diameter L1 of the first bump 301. The diameter L1 of the first bump 301 and the diameter L2 of the second bump 401 are diameters in cross sections parallel to the surface 120a. When the diameter L1 of the first bump 301 and the diameter L2 of the second bump 401 are different according to a position in the thickness direction D1 of the first substrate 100, the diameter L2 of the second bump 401 is smaller than the diameter L1 of the first bump 301 at the same position in the thickness direction D1 of the first substrate 100. The maximum diameter of the second bump 401 is smaller than the minimum diameter of the first bump 301.

The first base electrode 302b and the second base electrode 402b may not be disposed. That is, the first bump 301 and the second bump 401 may be in contact with the surface 220a. The first base electrode 302a may be disposed in the third area A3 and the first base electrode 302b may be disposed in the first area A1. The second base electrode 402a may be disposed in the fourth area A4 and the second base electrode 402b may be disposed in the second area A2.

Figure 2:
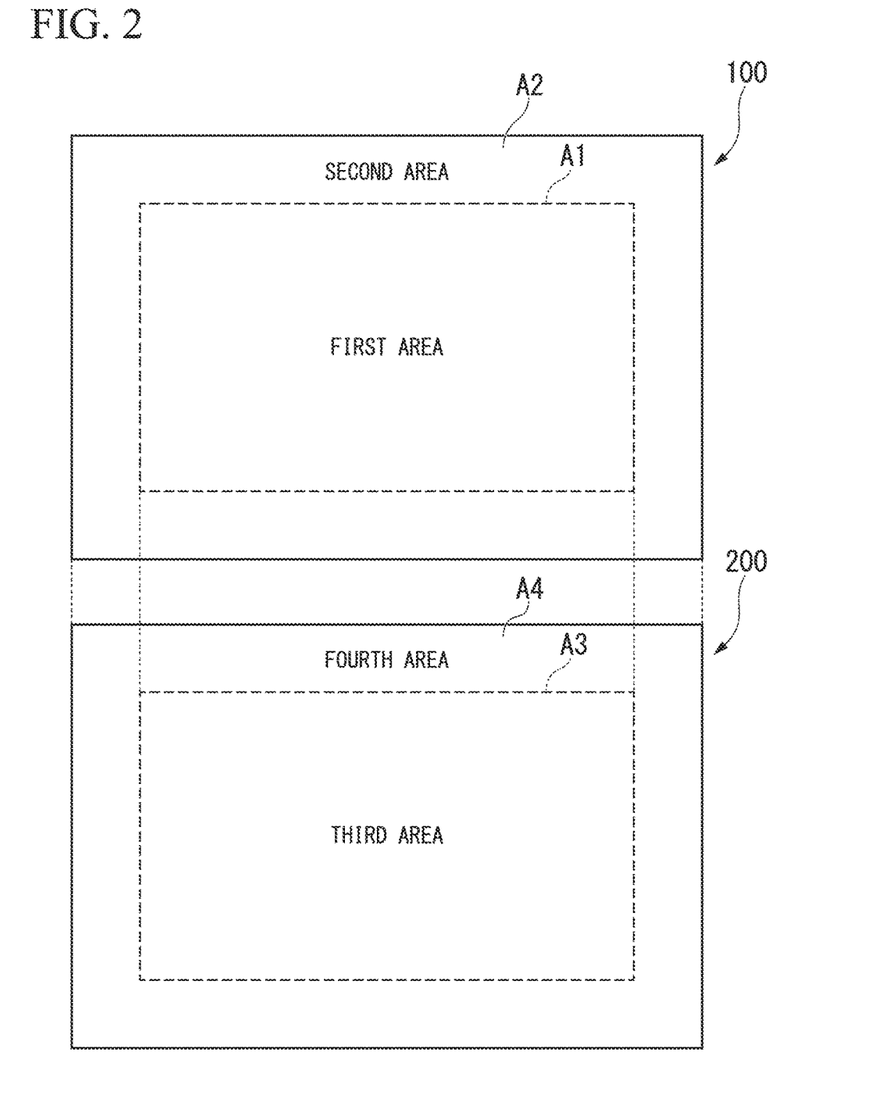
FIG. 2 is a plan view of a first substrate and a second substrate in a semiconductor device according to the first embodiment of the present invention.

FIG. 2 is a plan view of the first substrate 100 and the second substrate 200. In FIG. 2, positions of the first area A1 and the second area A2 on the surface 120a, and positions of the third area A3 and the fourth area A4 on the surface 220a are shown.

The first area A1 is an area including the center of the surface 120a. On the surface 120a, the second area A2 surrounds the first area A1. That is, the second area A2 is an area surrounding the first area A1. The area (size) of the second area A2 is smaller than the area (size) of the first area A1. The third area A3 is an area including the center of the surface 220a. On the surface 220a, the fourth area A4 surrounds the third area A3. That is, the fourth area A4 is an area surrounding the third area A3. The area (size) of the fourth area A4 is smaller than the area (size) of the third area A3.

A plurality of first connecting portions 300 are disposed in the first area A1 and the third area A3. The third area A3 faces the first area A1. A plurality of second connecting portions 400 are disposed in the second area A2 and the fourth area A4. The fourth area A4 faces the second area A2.

Figure 3:
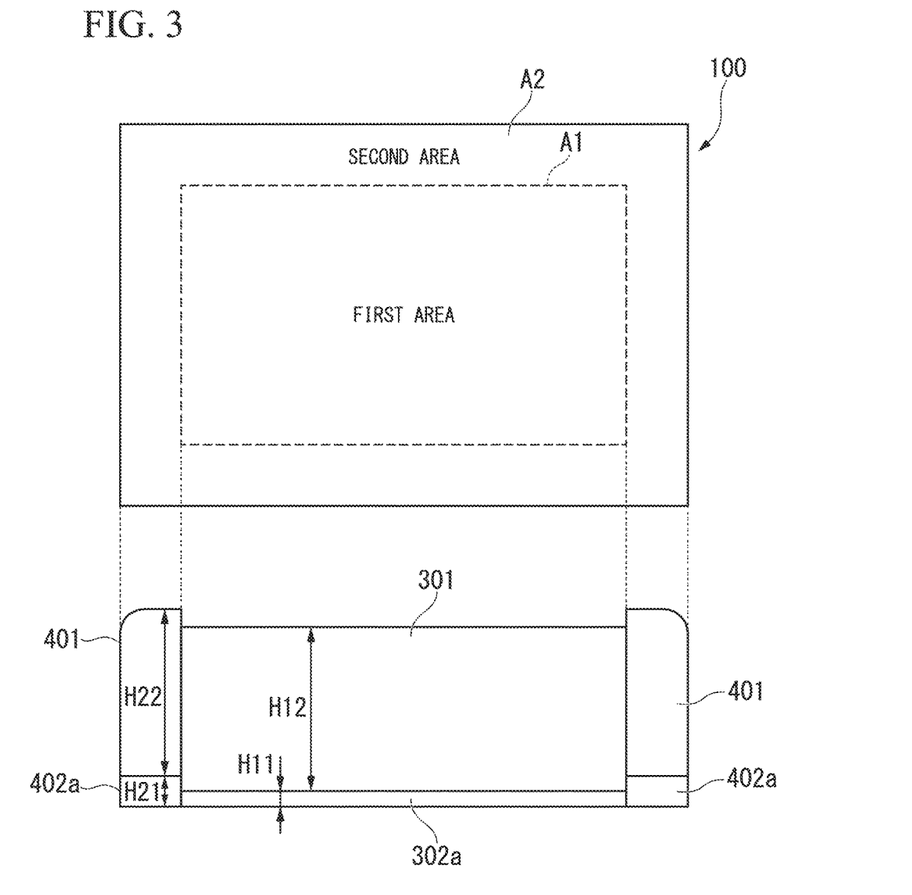
FIG. 3 is a plan view of a substrate and a cross-sectional view of a connecting portion in the semiconductor device according to the first embodiment of the present invention.

FIG. 3 is a plan view of the first substrate 100 and a cross-sectional view of a connecting portion. In FIG. 3, cross sections of the first bump 301, the first base electrode 302a, the second bump 401, and the second base electrode 402a before the first substrate 100 and the second substrate 200 are bonded to each other are shown.

In FIG. 3, the first substrate 100 and a connecting portion are schematically shown. For example, a ratio between a width of the first substrate 100 and a height of the connecting portion is different from a ratio in the actual semiconductor device 10. A plurality of connecting portions are disposed on the surface of the first substrate 100 at high density. In FIG. 3, the connecting portion is drawn as an aggregate of a plurality of connecting portions.

Before the first substrate 100 and the second substrate 200 are bonded to each other, the height H22 of the second bump 401 is smaller than the height H12 of the first bump 301 on average. The height H22 of the second bump 401 decreases toward the outside from the center of the first substrate 100. In the first embodiment, the height H21 of the second base electrode 402a is greater than the height H11 of the first base electrode 302a. Therefore, a total of the height H21 of the second base electrode 402a and the height H22 of the second bump 401 are greater than a total of the height H11 of the first base electrode 302a and the height H12 of the first bump 301 on average.

The height H21 of the second base electrode 402a is set so that a total of the height H21 of the second base electrode 402a and the height H22 of the second bump 401 on the outermost portion of the second area A2 are a total of the height H11 of the first base electrode 302a and the height H12 of the first bump 301 or greater. For example, when the height H12 of the first bump 301 is 4 μm, on the outermost portion of the second area A2, the height H22 of the second bump 401 is 0.2 μm smaller than the height H12 of the first bump 301. In this case, the height H21 of the second base electrode 402a is 0.2 μm greater than the height H11 of the first base electrode 302a or more.

Figure 4:
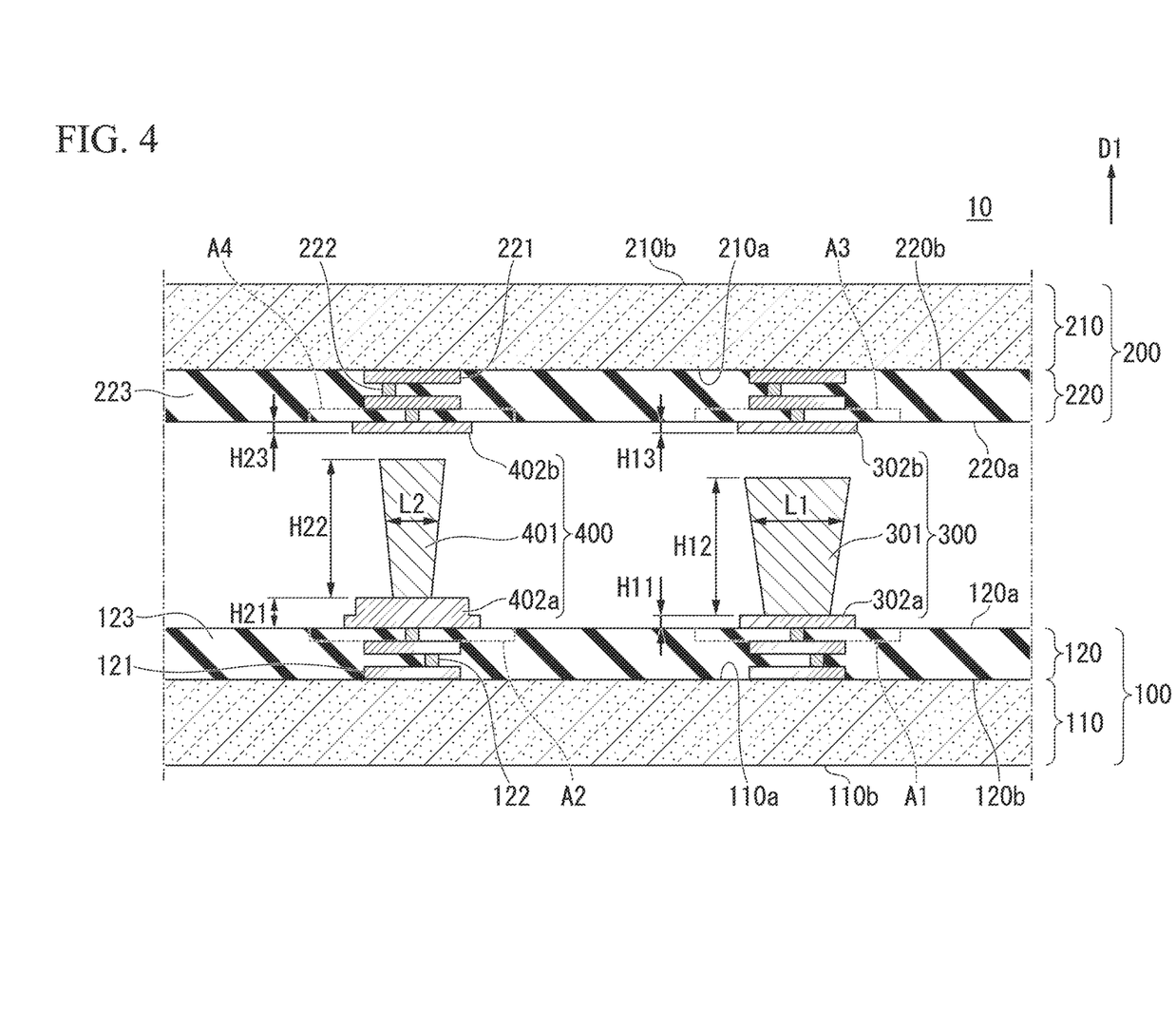
FIG. 4 is a cross-sectional view of the semiconductor device according to the first embodiment of the present invention.

FIG. 4 shows a state of the semiconductor device 10 before the first substrate 100 and the second substrate 200 are bonded to each other. In FIG. 4, a cross section of the semiconductor device 10 is shown.

In FIG. 4, a total of the height H21 of the second base electrode 402a and the height H22 of the second bump 401 are greater than a total of the height H11 of the first base electrode 302a and the height H12 of the first bump 301. The height H13 of the first base electrode 302b and the height H23 of the second base electrode 402b are almost the same. Therefore, the height of the second connecting portion 400 in the thickness direction D1 of the first substrate 100 is greater than the height of the first connecting portion 300 in the thickness direction.

When the first substrate 100 and the second substrate 200 are bonded to each other, the second bump 401 comes into contact with the second base electrode 402b before the first bump 301 comes into contact with the first base electrode 302b. The upper part of the second bump 401 is crushed due to a load. Therefore, the height H22 of the second bump 401 becomes smaller. As a result, as shown in FIG. 1, the first bump 301 comes into contact with the first base electrode 302b. The first substrate 100 and the second substrate 200 are electrically connected by the first connecting portion 300 and the second connecting portion 400. Therefore, it is possible to reduce connection defects in the connecting portions.

A difference between the height H21 of the second base electrode 402a and the height H11 of the first base electrode 302a may be small. When the height H21 of the second base electrode 402a is greater than the height H11 of the first base electrode 302a, a difference of heights between the first bump 301 and the second bump 401 becomes smaller. Therefore, the first bump 301 is easy to come in contact with the first base electrode 302b and the second bump 401 is easy to come in contact the second base electrode 402b.

The area of the second area A2 is smaller than the area of the first area A1 and the area of the fourth area A4 is smaller than the area of the third area A3. Therefore, the number of the plurality of second connecting portions 400 is smaller than the number of the plurality of first connecting portions 300. Therefore, a load necessary for crushing the second bump 401 is smaller than a load necessary for crushing the first bump 301. Further, when the diameter L2 of the second bump 401 is set to be smaller than the diameter L1 of the first bump 301, a load necessary for crushing the second bump 401 is reduced.

Figure 5:
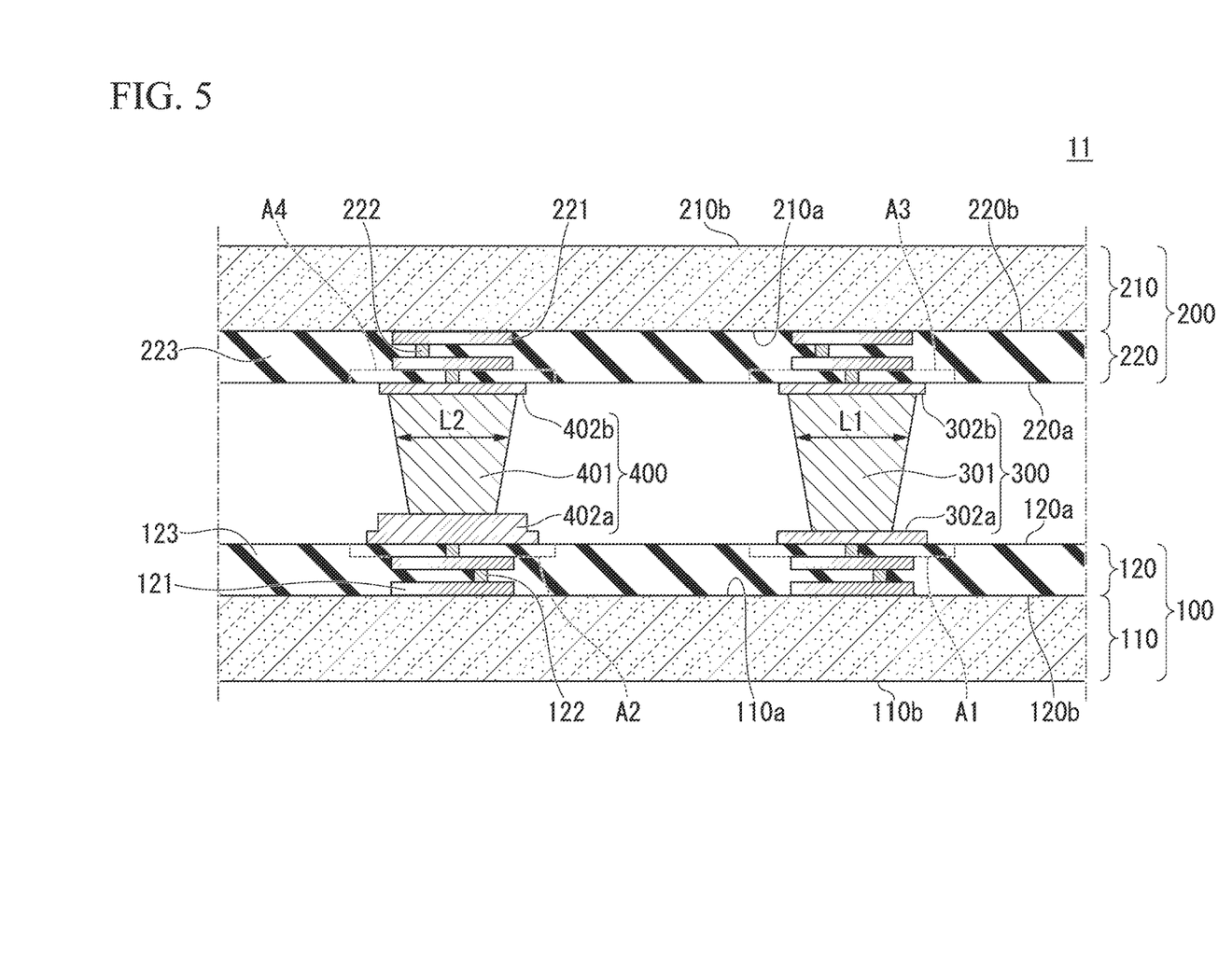
FIG. 5 is a cross-sectional view of a semiconductor device of a modified example of the first embodiment of the present invention.

FIG. 5 shows a configuration of a semiconductor device 11 of a modified example of the first embodiment. In FIG. 5, a cross section of the semiconductor device 11 is shown.

Points in the configuration shown in FIG. 5 which are different from the configuration shown in FIG. 1 will be described. In FIG. 5, the diameter L1 of the first bump 301 and the diameter L2 of the second bump 401 are almost the same. When the diameter L1 of the first bump 301 and the diameter L2 of the second bump 401 are different according to a position in the thickness direction D1 of the first substrate 100, the diameter L1 of the first bump 301 and the diameter L2 of the second bump 401 are almost the same at the same position in the thickness direction D1 of the first substrate 100.

Regarding points other than the above points, the configuration shown in FIG. 5 is similar to the configuration shown in FIG. 1.

As described above, the semiconductor devices 10 and 11 of the first embodiment include a plurality of first connecting portions 300, a plurality of second connecting portions 400, the first substrate 100, and the second substrate 200. Each of the plurality of first connecting portions 300 includes the first bump 301 and the first base electrode 302a. Each of the plurality of second connecting portions 400 includes the second bump 401 and the second base electrode 402a.

The semiconductor device of each of the aspects of the present invention may not have a configuration part corresponding to at least one of the first semiconductor layer 110, the first via 122, the first interlayer insulating film 123, the second semiconductor layer 210, the second via 222, the second interlayer insulating film 223, the first base electrode 302b, and the second base electrode 402b. The semiconductor device of each of the aspects of the present invention may include three or more substrates. When the semiconductor device includes three or more substrates, two adjacent substrates correspond to the first substrate 100 and the second substrate 200.

In the first embodiment, the height H21 of the second base electrode 402a in the thickness direction D1 of the first substrate 100 is greater than the height H11 of the first base electrode 302a in the thickness direction D1. Therefore, it is possible to reduce connection defects in the connecting portions.

The diameter L2 of the second bump 401 may be smaller than the diameter L of the first bump 301. Therefore, a load necessary when the first substrate 100 and the second substrate 200 are bonded to each other is reduced.

Second Embodiment

Figure 6:
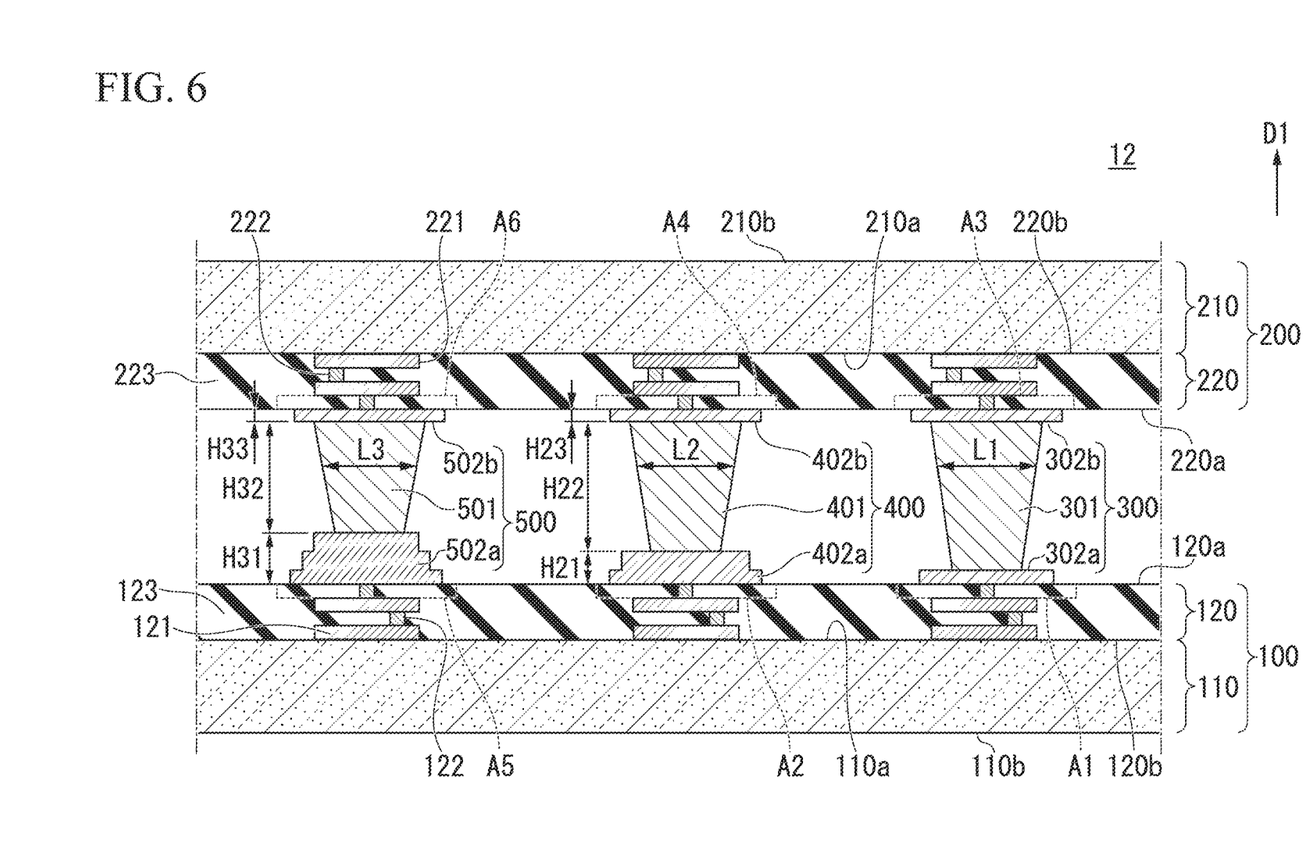
FIG. 6 is a cross-sectional view of a semiconductor device according to a second embodiment of the present invention.

FIG. 6 shows a configuration of a semiconductor device 12 of a second embodiment of the present invention. In FIG. 6, a cross section of the semiconductor device 12 is shown. As shown in FIG. 6, the semiconductor device 12 includes a first substrate 100, a second substrate 200, a first connecting portion 300, a second connecting portion 400, and a third connecting portion 500. The first substrate 100 and the second substrate 200 are connected to each other through the first connecting portion 300, the second connecting portion 400, and the third connecting portion 500. The first substrate 100 and the second substrate 200 are laminated in the thickness direction D1 of the first substrate 100.

Points in the configuration shown in FIG. 6 which are different from the configuration shown in FIG. 1 will be described. The semiconductor device 12 includes a plurality of third connecting portions 500. In FIG. 6, one third connecting portion 500 is shown as a representative.

The surface 120a includes a fifth area A5 in which a plurality of third connecting portions 500 are disposed. The surface 220a includes a sixth area A6 in which a plurality of third connecting portions 500 are disposed.

The third connecting portion 500 is disposed between the first substrate 100 and the second substrate 200. The third connecting portion 500 is disposed in the fifth area A5 on the surface 120a and is disposed in the sixth area A6 on the surface 220a. The third connecting portion 500 electrically connects the first wiring 121 and the second wiring 221.

The third connecting portion 500 includes a third bump 501, a third base electrode 502a, and a third base electrode 502b. The third bump 501, the third base electrode 502a, and the third base electrode 502b are made of the fourth conductive material. For example, the fourth conductive material is a metal such as gold (Au), aluminum (Al), and copper (Cu).

The third bump 501 is disposed between the third base electrode 502a and the third base electrode 502b. The third bump 501 is in contact with the third base electrode 502a and the third base electrode 502b. The third base electrode 502a and the third base electrode 502b are disposed between any one of the fifth area A5 and the sixth area A6, and the third bump 501. In FIG. 6, the third base electrode 502a is disposed between the fifth area A5 and the third bump 501. The third base electrode 502a is in contact with the fifth area A5. The third base electrode 502a is in contact with the first via 122 in the fifth area A5. In FIG. 6, the third base electrode 502b is disposed between the sixth area A6 and the third bump 501. The third base electrode 502b is in contact with the sixth area A6. The third base electrode 502b is in contact with the second via 222 in the sixth area A6.

A height H31 of the third base electrode 502a in the thickness D1 direction of the first substrate 100 is greater than the height H21 of the second base electrode 402a in the thickness direction D1. For example, the second base electrode 402a and the third base electrode 502a include first layers formed at the same time. The second base electrode 402a and the third base electrode 502a further include second layers formed on the first layer at the same time. The third base electrode 502a further includes a third layer formed on the second layer.

A height H32 of the third bump 501 in the thickness D1 direction of the first substrate 100 is smaller than the height H22 of the second bump 401 in the thickness direction D1. A total of the height H21 of the second base electrode 402a and the height H22 of the second bump 401 and a total of the height H31 of the third base electrode 502a and the height H32 of the third bump 501 are almost the same.

The height H23 of the second base electrode 402b in the thickness D1 direction of the first substrate 100 and a height H33 of the third base electrode 502b in the thickness direction D1 are almost the same. Therefore, a height of the second connecting portion 400 in the thickness D1 direction of the first substrate 100 and a height of the third connecting portion 500 in the thickness direction D1 are almost the same. A height of the second connecting portion 400 is a total of the height H21 of the second base electrode 402a, the height H22 of the second bump 401, and the height H23 of the second base electrode 402b. A height of the third connecting portion 500 is a total of the height H31 of the third base electrode 502a, the height H32 of the third bump 501, and the height H33 of the third base electrode 502b.

A diameter L3 of the third bump 501, the diameter L2 of the second bump 401, and the diameter L1 of the first bump 301 are almost the same. The diameter L2 of the second bump 401 may be smaller than the diameter L1 of the first bump 301. The diameter L3 of the third bump 501 may be smaller than the diameter L2 of the second bump 401.

The third base electrode 502b may not be disposed. That is, the third bump 501 may be in contact with the surface 220a. The first base electrode 302a may be disposed in the third area A3 and the first base electrode 302b may be disposed in the first area A1. The second base electrode 402a may be disposed in the fourth area A4 and the second base electrode 402b may be disposed in the second area A2. The third base electrode 502a may be disposed in the sixth area A6 and the third base electrode 502b may be disposed in the fifth area A5.

Regarding points other than the above, the configuration shown in FIG. 6 is similar to the configuration shown in FIG. 1.

Figure 7:
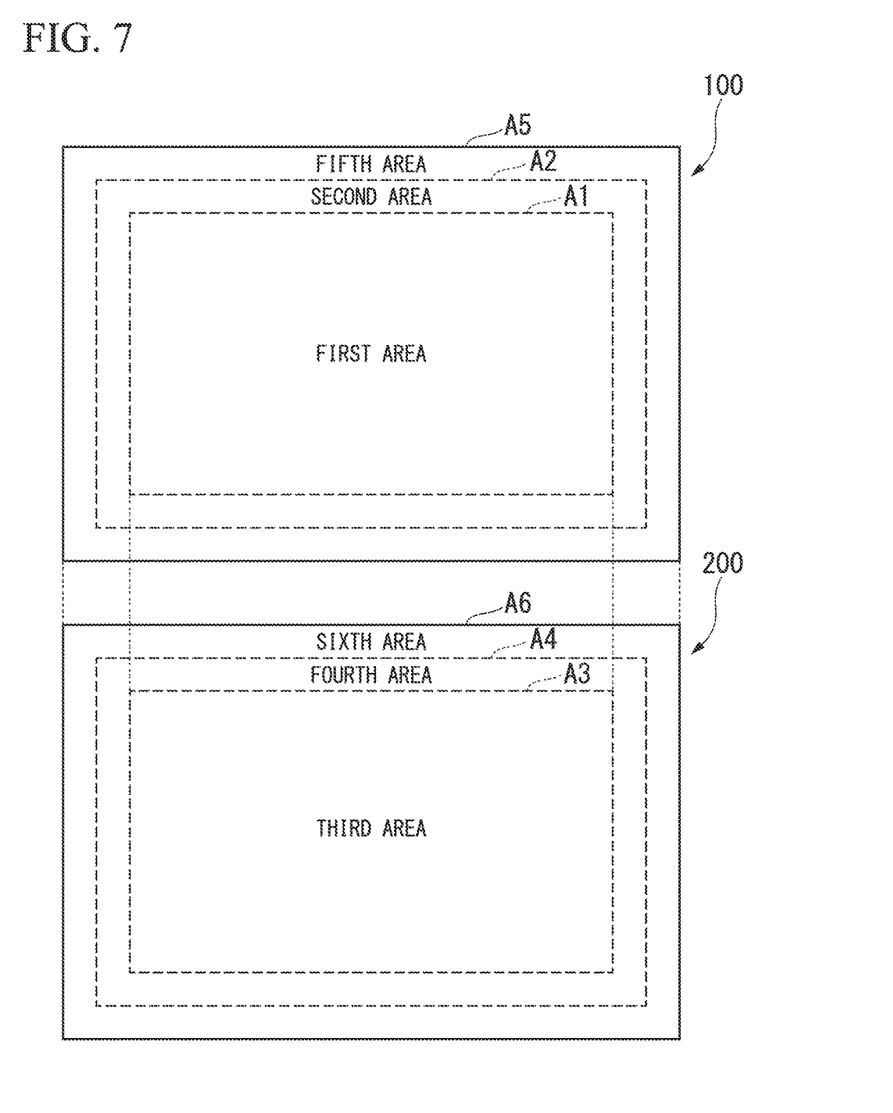
FIG. 7 is a plan view of a first substrate and a second substrate in the semiconductor device according to the second embodiment of the present invention.

FIG. 7 is a plan view of the first substrate 100 and the second substrate 200. In FIG. 7, positions of the first area A1, the second area A2, and the fifth area A5 on the surface 120a, and positions of the third area A3, the fourth area A4, and the sixth area A6 on the surface 220a are shown.

The first area A1 is an area including the center of the surface 120a. On the surface 120a, the second area A2 surrounds the first area A1. That is, the second area A2 is an area surrounding the first area A1. On the surface 120a, the fifth area A5 surrounds the first area A1 and the second area A2. That is, the fifth area A5 is an area surrounding the second area A2. The area (size) of the second area A2 and the area (size) of the fifth area A5 are smaller than the area (size) of the first area A1.

The third area A3 is an area including the center of the surface 220a. On the surface 220a, the fourth area A4 surrounds the third area A3. That is, the fourth area A4 is an area surrounding the third area A3. On the surface 220a, the sixth area A6 surrounds the third area A3 and the fourth area A4. That is, the sixth area A6 is an area surrounding the fourth area A4. The area (size) of the fourth area A4 and the area (size) of the sixth area A6 are smaller than the area (size) of the third area A3.

A plurality of first connecting portions 300 are disposed in the first area A1 and the third area A3. The third area A3 faces the first area A1. A plurality of second connecting portions 400 are disposed in the second area A2 and the fourth area A4. The fourth area A4 faces the second area A2. A plurality of third connecting portions 500 are disposed in the fifth area A5 and the sixth area A6. The sixth area A6 faces the fifth area A5.

In the second embodiment, the height H31 of the third base electrode 502a in the thickness direction D1 of the first substrate 100 is greater than the height H21 of the second base electrode 402a in the thickness direction D1. The heights of two types of connecting portion can be set in the first embodiment, and the heights of three types of connecting portion can be set in the second embodiment. Therefore, in the second embodiment, finer setting of the height of the connecting portion is possible. As a result, it is possible to further reduce connection defects in the connecting portions.

Third Embodiment

Figure 8:
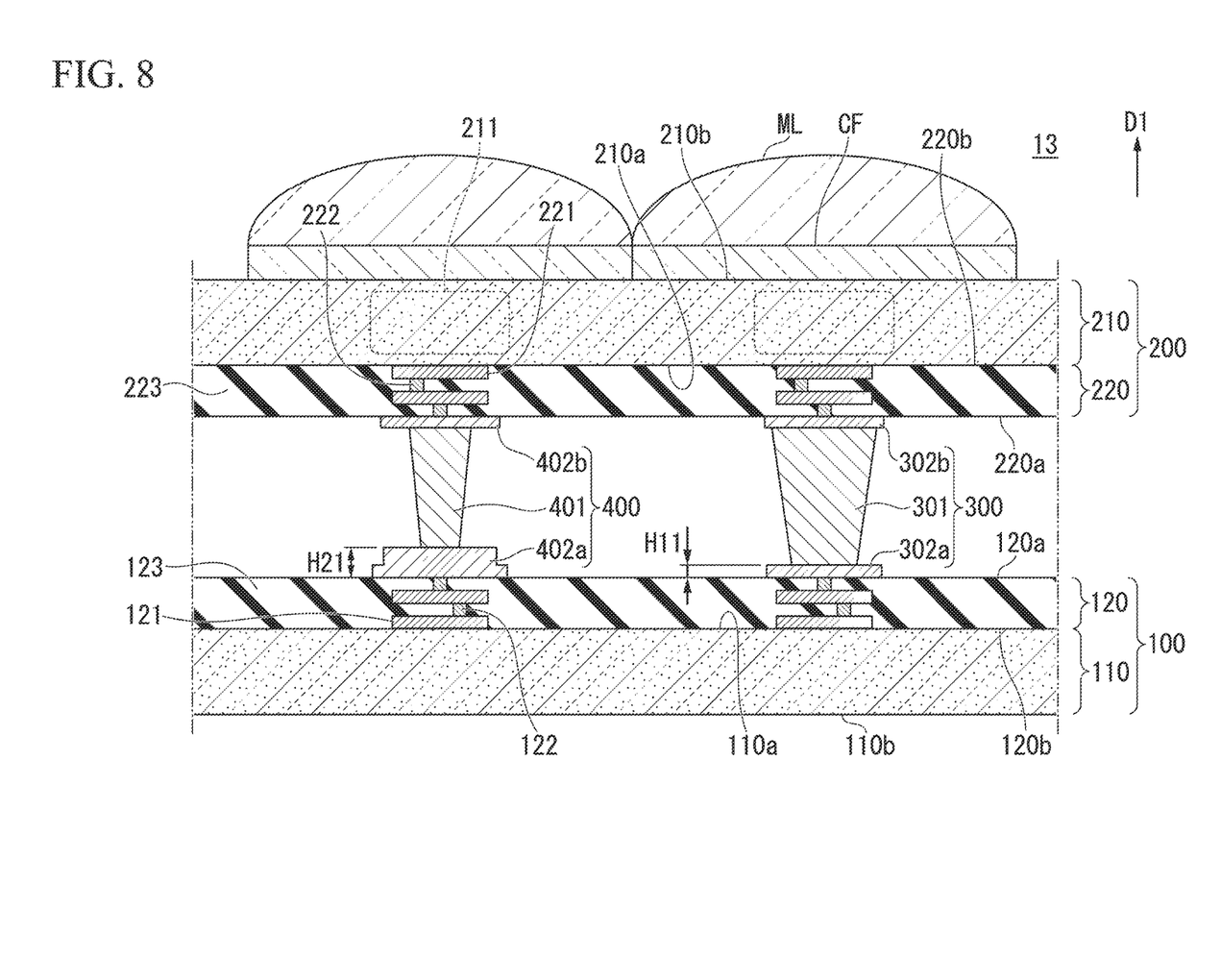
FIG. 8 is a cross-sectional view of a solid-state imaging device according to a third embodiment of the present invention.

FIG. 8 shows a configuration of a solid-state imaging device 13 of a third embodiment of the present invention.

The solid-state imaging device 13 is an example of the semiconductor device. In FIG. 8, a cross section of the solid-state imaging device 13 is shown. As shown in FIG. 8, the solid-state imaging device 13 includes a first substrate 100, a second substrate 200, a first connecting portion 300, a second connecting portion 400, a micro lens ML, and a color filter CF. The first substrate 100 and the second substrate 200 are connected through the first connecting portion 300 and the second connecting portion 400. The first substrate 100 and the second substrate 200 are laminated in the thickness direction D1 of the first substrate 100.

Points in the configuration shown in FIG. 8 which are different from the configuration shown in FIG. 1 will be described. The second semiconductor layer 210 includes a photoelectric conversion unit 211. While there are a plurality of photoelectric conversion units 211 in FIG. 8, the reference sign of one photoelectric conversion unit 211 is shown as a representative. For example, the photoelectric conversion unit 211 is made of a second semiconductor material whose impurity concentration is different from that of the second semiconductor material of the second semiconductor layer 210.

The color filter CF is disposed on the surface 210b and the micro lens ML is disposed on the color filter CF. While there are a plurality of micro lenses ML in FIG. 8, the reference sign of one micro lens ML is shown as a representative. In addition, while there are a plurality of color filters CF in FIG. 8, the reference sign of one color filter CF is shown as a representative.

Light from a subject that has passed through an imaging lens disposed in front of the solid-state imaging device 13 in an optical direction is incident on the micro lens ML. The micro lens ML forms an image of light that the imaging lens has transmitted. The color filter CF transmits light of a wavelength corresponding to a predetermined color.

Light transmitted by the micro lens ML and the color filter CF is incident on the second semiconductor layer 210. Light incident on the second semiconductor layer 210 travels within the second semiconductor layer 210 and is incident on the photoelectric conversion unit 211. The photoelectric conversion unit 211 converts the incident light into a signal.

Regarding points other than the above, the configuration shown in FIG. 8 is similar to the configuration shown in FIG. 1.

The solid-state imaging device 13 may include the third connecting portion 500 shown in FIG. 6.

In the third embodiment, the height H21 of the second base electrode 402a in the thickness direction D1 of the first substrate 100 is greater than the height H11 of the first base electrode 302a in the thickness direction D1. Therefore, it is possible to reduce connection defects in the connecting portions.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device, comprising:
   a plurality of first connecting portions that electrically connect a first wiring and a second wiring;
   a plurality of second connecting portions that electrically connect the first wiring and the second wiring;

a first substrate which includes a first surface and the first wiring and contains a first semiconductor material, the first surface including a first area in which the plurality of first connecting portions are disposed and a second area in which the plurality of second connecting portions are disposed; and a second substrate which includes a second surface and the second wiring and contains a second semiconductor material, the second surface facing the first surface, and the second surface including a third area in which the plurality of first connecting portions are disposed and a fourth area in which the plurality of second connecting portions are disposed;

wherein each of the plurality of first connecting portions includes
a first bump, and
a first base electrode that is disposed between any one of the first area and the third area, and the first bump, wherein each of the plurality of second connecting portions includes
a second bump, and
a second base electrode that is disposed between any one of the second area and the fourth area, and the second bump, wherein the second area surrounds the first area on the first surface, wherein the fourth area surrounds the third area on the second surface, and wherein a height of the second base electrode in a thickness direction of the first substrate is greater than a height of the first base electrode in the thickness direction.

2. The semiconductor device according to claim 1, wherein a diameter of the second bump is smaller than a diameter of the first bump.

3. The semiconductor device according to claim 1, wherein the semiconductor device further includes a plurality of third connecting portions that electrically connect the first wiring and the second wiring, wherein the first surface further includes a fifth area in which the plurality of third connecting portions are disposed, wherein the second surface further includes a sixth area in which the plurality of third connecting portions are disposed, wherein each of the plurality of third connecting portions includes
a third bump, and
a third base electrode that is disposed between any one of the fifth area and the sixth area, and the third bump, wherein the fifth area surrounds the first area and the second area on the first surface, wherein the sixth area surrounds the third area and the fourth area on the second surface, and wherein a height of the third base electrode in the thickness direction is greater than the height of the second base electrode in the thickness direction.

4. The semiconductor device according to claim 1, wherein a height of the second connecting portion in the thickness direction is greater than a height of the first connecting portion in the thickness direction.

* * * * *